United States Patent
Akcakaya et al.

(10) Patent No.: US 11,694,373 B2
(45) Date of Patent: Jul. 4, 2023

(54) METHODS FOR SCAN-SPECIFIC K-SPACE INTERPOLATION RECONSTRUCTION IN MAGNETIC RESONANCE IMAGING USING MACHINE LEARNING

(71) Applicant: REGENTS OF THE UNIVERSITY OF MINNESOTA, Minneapolis, MN (US)

(72) Inventors: Mehmet Akcakaya, Minneapolis, MN (US); Steen Moeller, Minneapolis, MN (US)

(73) Assignee: REGENTS OF THE UNIVERSITY OF MINNESOTA, Minneapolis, MN (US)

(*) Notice: Subject to any disclaimer, the term of this patent is extended or adjusted under 35 U.S.C. 154(b) by 702 days.

(21) Appl. No.: 16/603,336

(22) PCT Filed: Mar. 14, 2018

(86) PCT No.: PCT/US2018/022348
§ 371 (c)(1),
(2) Date: Oct. 7, 2019

(87) PCT Pub. No.: WO2018/187005
PCT Pub. Date: Oct. 11, 2018

(65) Prior Publication Data
US 2021/0090306 A1 Mar. 25, 2021

Related U.S. Application Data

(60) Provisional application No. 62/637,852, filed on Mar. 2, 2018, provisional application No. 62/482,760, filed on Apr. 7, 2017.

(51) Int. Cl.
*G06K 9/00* (2022.01)
*G06T 11/00* (2006.01)
(Continued)

(52) U.S. Cl.
CPC .......... *G06T 11/005* (2013.01); *G01R 33/482* (2013.01); *G01R 33/4824* (2013.01);
(Continued)

(58) Field of Classification Search
CPC ... G06T 11/005; G06T 11/006; G01R 33/482; G01R 33/4824; G01R 33/4835;
(Continued)

(56) References Cited

U.S. PATENT DOCUMENTS

2008/0197842 A1* 8/2008 Lustig ............... G01R 33/5635
324/307
2010/0237864 A1* 9/2010 Stemmer ........... G01R 33/4824
324/309

(Continued)

OTHER PUBLICATIONS

Lee, Dongwook, Jaejun Yoo, and Jong Chui Ye. "Deep artifact learning for compressed sensing and parallel MRI." arXiv preprint arXiv:1703.01120 (2017). (Year: 2017).*

(Continued)

*Primary Examiner* — Avinash Yentrapati
(74) *Attorney, Agent, or Firm* — Quarles & Brady LLP

(57) ABSTRACT

Methods for reconstructing images from undersampled k-space data using a machine learning approach to learn non-linear mapping functions from acquired k-space lines to generate unacquired target points across multiple coils are described.

25 Claims, 4 Drawing Sheets

(51) Int. Cl.
  G01R 33/48 (2006.01)
  G01R 33/483 (2006.01)
  G01R 33/56 (2006.01)
  G01R 33/561 (2006.01)
  G06N 3/04 (2023.01)
  G06N 3/08 (2023.01)
(52) U.S. Cl.
  CPC ..... G01R 33/4835 (2013.01); G01R 33/5608 (2013.01); G01R 33/5611 (2013.01); G06N 3/04 (2013.01); G06N 3/08 (2013.01); G06T 11/006 (2013.01)
(58) Field of Classification Search
  CPC .. G01R 33/5608; G01R 33/5611; G06N 3/04; G06N 3/08
  See application file for complete search history.

(56) References Cited

U.S. PATENT DOCUMENTS

| | | | | |
|---|---|---|---|---|
| 2013/0099784 | A1* | 4/2013 | Setsompop | G01R 33/543 324/309 |
| 2013/0099786 | A1* | 4/2013 | Huang | G01R 33/246 324/309 |
| 2014/0218026 | A1* | 8/2014 | Moeller | G01R 33/4835 324/309 |
| 2015/0238148 | A1* | 8/2015 | Georgescu | G06T 7/0012 600/408 |
| 2016/0162782 | A1* | 6/2016 | Park | G06N 3/082 706/17 |
| 2016/0187446 | A1* | 6/2016 | Zhou | G01R 33/5611 324/309 |
| 2017/0038452 | A1* | 2/2017 | Trzasko | G01R 33/482 |
| 2018/0144510 | A1* | 5/2018 | Lachaine | G06T 11/003 |
| 2019/0325621 | A1* | 10/2019 | Wang | G06N 20/00 |
| 2020/0405269 | A1* | 12/2020 | Swisher | A61B 8/4444 |

OTHER PUBLICATIONS

Chang, Yuchou, Dong Liang, and Leslie Ying. "Nonlinear GRAPPA: A kernel approach to parallel MRI reconstruction." Magnetic Resonance in Medicine 68.3 (2012): 730-740. (Year: 2012).*
Xu, Lin, et al. "Robust GRAPPA reconstruction using sparse multi-kernel learning with least squares support vector regression." Magnetic Resonance Imaging 32.1 (2014): 91-101. (Year: 2014).*
LeCun, Yann, Yoshua Bengio, and Geoffrey Hinton. "Deep learning." nature 521.7553 (2015): 436-444. (Year: 2015).*
Akcakaya M, Basha TA, Chan RH, Manning WJ, Nezafat R. Accelerated isotropic sub-millimeter whole-heart coronary MRI: Compressed sensing versus parallel imaging. Magn Reson Med 2014;71(2):815-822.
Akcakaya M, Basha A, Goddu B, Goepfert LA, Kissinger KV, arokh V, Manning WJ, Nezafat R. Low-dimensional-structure self-learning and thresholding: Regularization beyond compressed sensing for MRI Reconstruction. Magn Reson Med 2011;66(3):756-767.
Chang, Y., et al. "Nonlinear GRAPPA: A kernel approach to parallel MRI reconstruction." Magnetic Resonance in Medicine 68.3 (2012): 730-740.
Dong C, Loy CC, He K, Tang X. Image Super-Resolution Using Deep Convolutional Networks. IEEE Transactions on Pattern Analysis and Machine Intelligence 2016;38(2):295-307.
Elad M, Aharon M. Image denoising via sparse and redundant representations over learned dictionaries. IEEE Transactions on Image Processing 2006:15(12):3736-3745.
Glorot X, Bordes A, Bengio Y. Deep sparse rectifier neural networks. 2011; Ft. Lauderdale, International Conference on Artificial Intelligence and Statistics, p. 315-323.
Hammernik, K., Klatzer, T., Kobler, E., Recht, M. P., Sodickson, D. K., Pock, T. & Knoll, F. Learning a variational network for reconstruction of accelerated MRI data. (2017) Magn Reson Med Published on line before Print; DOI: 10.1002/mrm.26977.
Han YS, Yoo J, Ye JC. Deep Learning with Domain Adaptation for Accelerated Projection Reconstruction MR. preprint 2017:arXiv:1703.01135.
International Searching Authority. International Search Report and Written Opinion for application PCT/US2018/022348, dated May 25, 2018. 11 pages.
Ioffe et al, Batch Normalization: Accelerating Deep Network Training by Reducing Internal Covariate Shift. ICML, 2015.
Krizhevsky A, Sutskever I, Hinton G. ImageNet classification with deep convolutional neural networks. 2012; Lake Tahoe. Advances in Neural Information Processing Systems (NIPS), p. 1097-1105.
Kwon K, Kim D, Park H. A parallel MR imaging method using multilayer perceptron. Med Phys 2017.
Lee, D., et al. "Deep artifact learning for compressed sensing and parallel MRI." arXiv preprint arXiv:1703.01120 (2017).
Liu, B., Wang, M., Foroosh, H., Tappen, M. & Pensky, M. Sparse convolutional neural networks. in IEEE Conference on Computer Vision and Pattern Recognition. (2015) 806-814 (IEEE Conference on Computer Vision and Pattern Recognition).
Ronneberger O, Fischer P, Brox T. U-Net: Convolutional Networks for Biomedical Image Segmentation, In: Navab N, Hornegger J, Wells WM, Frangi AF, editors. Medical Image Computing and Computer-Assisted Intervention—MICCAI 2015: 18th International Conference, Munich, Germany, Oct. 5-9, 2015, Proceedings, Part III. Cham: Springer International Publishing; 2015. p. 234-241.
Schlemper, J. et al. "A deep cascade of convolutional neural networks for dynamic MR image reconstruction," IEEE Trans Med Imaging, vol. 37, No. 2, pp. 491-503, 2018.
Uecker, M., Hohage, T., Block, K. T. & Frahm, J. Image reconstruction by regularized nonlinear inversion-joint estimation of coil sensitivities and image content. (2008) Magn Reson Med 60, 674-682.
Wang, S., et al. "Accelerating magnetic resonance imaging via deep learning." 2016 IEEE 13th international symposium on biomedical imaging (ISBI). IEEE, 2016.
Yaman, B., Weingartner, S., Kargas, N., Sidiropoulos, N. & Akcakaya, M. Locally Low-Rank Tensor Regularization for High-Resolution Quantitative Dynamic MRI. in IEEE International Workshop on Computational Advances in Multi-Sensor Adaptive Processing. (2017) 29-33 (IEEE International Workshop on Computational Advances in Multi-Sensor Adaptive Processing).
Yeh, E. N., Stuber, M., McKenzie, C. A., Botnar, R. M., Leiner, T., Ohliger, M. A., Grant, A. K., Willig-Onwuachi, J. D. & Sodickson, D. K. Inherently self-calibrating non-Cartesian parallel imaging. (2005) Magn Reson Med 54, 1-8.

* cited by examiner

METHODS FOR SCAN-SPECIFIC K-SPACE INTERPOLATION RECONSTRUCTION IN MAGNETIC RESONANCE IMAGING USING MACHINE LEARNING

CROSS REFERENCE TO RELATED APPLICATIONS

This application is a U.S. National Stage of PCT Application No. PCT/US2018/022348 filed on Mar. 14, 2018 which claims the benefit of U.S. Provisional Patent Application Ser. No. 62/482,760, filed on Apr. 7, 2017, and entitled "METHODS FOR KERNEL-BASED ACCELERATED MAGNETIC RESONANCE IMAGING USING MACHINE LEARNING," and U.S. Provisional Patent Application Ser. No. 62/637,852, filed on Mar. 2, 2018, and entitled "METHODS FOR KERNEL-BASED ACCELERATED MAGNETIC RESONANCE IMAGING USING MACHINE LEARNING," both of which are herein incorporated by reference in their entirety.

STATEMENT REGARDING FEDERALLY SPONSORED RESEARCH

This invention was made with government support under HL111410 and EB015894 awarded by the National Institutes of Health. The government has certain rights in the invention.

BACKGROUND

Parallel imaging reconstruction can be performed either in image domain using a least-squares approach (e.g., SENSE) or in k-space using an interpolation approach (e.g., GRAPPA). The k-space methods rely on using linear convolution kernels that map the acquired data across multiple coils to a target, unacquired point in a specific coil. These convolution kernels are generated from auto-calibration data, either acquired in a separate scan or interleaved into the acquisition as additional central k-space lines. Linear convolution kernel-based methods are also used in other accelerated imaging applications, such as combination of compressed sensing and parallel imaging (e.g., SPIRiT), and in simultaneous multislice imaging. Typical kernel sizes are generally well-localized (e.g., 5×4, 3×3, 7×7).

Recent studies suggest that non-linear approaches to interpolation may also be useful. Currently, these approaches create "virtual channels," which essentially map the dataset non-linearly to a higher dimension, and then use linear convolution in this higher dimension. These virtual channels are generated manually by the algorithm designer in an ad-hoc manner, however, which limits their applicability to specific datasets, hindering its real-life applicability.

SUMMARY OF THE DISCLOSURE

The present disclosure addresses the aforementioned drawbacks by providing a method for reconstructing an image from undersampled k-space data acquired with a magnetic resonance imaging (MRI) system. Undersampled k-space data acquired with an MRI system, and calibration data acquired with the MRI system are provided to a computer system. The calibration data may include auto-calibration (ACS) signal data acquired with the undersampled k-space data, or may include calibration data acquired in a separate scan from the undersampled k-space data. The calibration data is processed to learn parameters for a machine learning algorithm implemented with a hardware processor and memory of a computer system. Missing k-space data are estimated by inputting the undersampled k-space data to the machine learning algorithm, and an image is reconstructed from the undersampled k-space data and the missing k-space data.

It is another aspect of the present disclosure to provide a method for reconstructing an image from undersampled k-space data acquired with a magnetic resonance imaging (MRI) system. Undersampled k-space data acquired with an MRI system, and calibration data acquired with the MRI system are provided to a computer system. The calibration data may include auto-calibration (ACS) signal data acquired with the undersampled k-space data, or may include calibration data acquired in a separate scan from the undersampled k-space data. The calibration data is processed to learn parameters for a convolutional neural network. The convolutional neural network includes a plurality of layers in which each layer includes applying a convolution operation on data input to that layer. Each of the plurality of layers includes a number of input channels and a number of output channels, and at least some of the plurality of layers include applying non-linear processing on an output of the convolution operator. The learned parameters include weights, biases, or both for the convolution operation in each layer. Missing k-space data are estimated by inputting the undersampled k-space data to the convolutional neural network, and an image is reconstructed from the undersampled k-space data and the missing k-space data.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Figure 1:
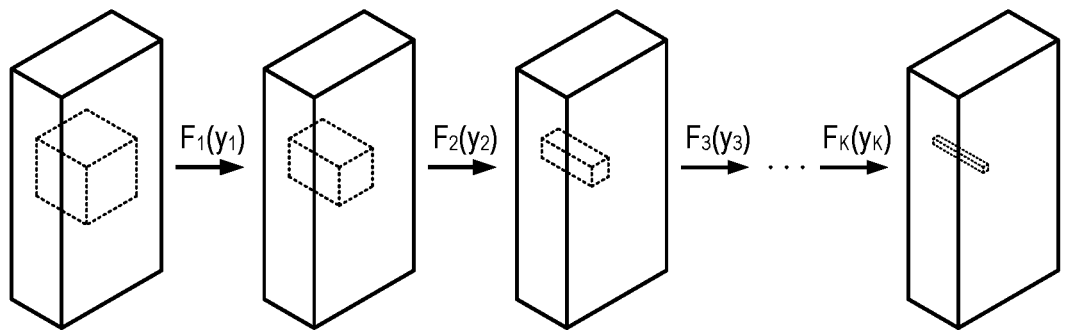
FIG. 1 illustrates an example of a machine learning algorithm for estimating missing k-space data from an input undersampled k-space data set.

Described here are systems and methods for reconstructing images from undersampled k-space data using a machine learning algorithm implemented with a hardware processor and a memory to estimate missing k-space lines from acquired k-space data with improved noise resilience. In general, the machine learning algorithm is trained on calibration data, such as auto-calibration signal ("AC S") data, and enables a non-linear estimation of missing k-space lines. For instance, non-linear mapping functions from acquired k-space lines can be learned and used to generate unacquired target points across multiple coils. Machine learning algorithms, including artificial neural networks, are able to represent complex nonlinear functions by combining layers of simple modules, which may include linear convolutions and point-wise nonlinear operators.

The systems and methods described in the present disclosure can implement neural networks, such as convolutional neural networks, or other machine learning algorithms that are trained on ACS or other calibration data. For instance, a convolutional neural network that enables non-linear processing can be trained, instead of linear convolution kernels. In doing so, the systems and methods described in the present disclosure do not need to make assumptions to generate "virtual channels"; rather, the systems and methods described in the present disclosure can train the data self-consistently from the acquired ACS or other calibration data. Advantageously, the systems and methods described in the present disclosure do not need to train a machine learning algorithm from additional scans contained in a database, as is common with other general machine learning algorithms.

As described above, one way to learn these non-linear mapping functions is via the training of a neural network or other machine learning algorithm. As one example, the neural network can be an artificial neural network ("ANN") or a convolutional neural network ("CNN"). In general, the methods seek to find a non-linear function that takes a certain neighborhood of acquired k-space points and generates a specific unacquired k-space point. Thus, in the machine learning setup, the inputs to the machine learning algorithm are a neighborhood of specific points (similar to traditional GRAPPA), and the labels are the unacquired k-space points at target locations for that neighborhood.

Reconstruction methods based on interpolation kernels in k-space traditionally synthesize missing k-space lines as a linear combination of acquired lines across all coils. For uniformly undersampled k-space data, GRAPPA uses linear convolutional kernels to estimate the missing data. Thus, for the $j^{th}$ coil k-space data, $S_j$, $$S_j(k_x, k_y - m\Delta k_y) = \sum_{c=1}^{n_c} \sum_{b_x=-B_x}^{B_x} \sum_{b_y=-B_y}^{B_y} g_{j,m}(b_x, b_y, c) S_c(k_x - b_x \Delta k_x, k_y - R b_y \Delta k_y); \quad (1)$$

where R is the acceleration rate; $S_j(k_x,k_y-m\Delta k_y)$ are the unacquired k-space lines, with m=1, . . . , R−1; $g_{j,m}(b_x,b_y,c)$ are the linear convolution kernels for estimating the data in the $j^{th}$ coil specified by the location m as above; $n_c$ is the number of coils; and $B_x$ and $B_y$ are specified by the kernel size.

The convolutional kernels, $g_{j,m}$, are estimated prior to the reconstruction. This is typically done by acquiring calibration data from a region (e.g., the ACS region), either integrated into the undersampled acquisition as central k-space lines or as a separate acquisition. Subsequently, a sliding window approach can be used in the ACS region to identify the fully-sampled acquisition locations specified by the kernel size and the corresponding missing entries. The former, taken across all coils, can be used as rows of a calibration matrix, A; while the latter, for a specific coil, yields a single entry in the target vector, b. Thus for each coil, j, and missing location, m=1, . . . , R−1, a set of linear equations are formed, from which the vectorized kernel weights $g_{j,m}(b_x,b_y,c)$, denoted $g_{j,m}$, are estimated. As one example, the kernel weights can be estimated via least squares, $$g_{j,m} = \operatorname*{argmin}_{g} \|b - Ag\|_2. \quad (2)$$

Because the encoding process in a multi-coil MRI acquisition is linear, the reconstruction for sub-sampled data is also expected to be linear. This is the premise of linear parallel imaging methods, which aim to estimate the underlying reconstruction process that exploits redundancies in the multi-coil acquisition using a linear system with a few degrees of freedom. These degrees of freedom are captured in the small convolutional kernel sizes for GRAPPA, or the smooth coil sensitivity maps for SENSE. In essence, linear functions with such limited degrees of freedoms form a subset of all linear functions. In linear parallel imaging, the underlying reconstruction is approximated with a function from this restricted subset.

It is a discovery of the present disclosure that the underlying reconstruction function, although linear in nature, can be better approximated from a restricted subset of non-linear functions with similarly few degrees of freedom (e.g., parameters of the trained machine learning algorithm, which may be a CNN). As one non-limiting example, if the true underlying linear mapping is n-dimensional, an m-dimensional nonlinear mapping may outperform an m-dimensional linear mapping, where m<n. The systems and methods described in the present disclosure estimate missing k-space lines from acquired ones using such a non-linear mapping.

The modeling of this non-linear process can be confined to a few degrees of freedom using an appropriately trained machine learning algorithm, such as a CNN. The degrees of freedom may refer to the coefficients of the linear convolutional kernels. This restricted, yet non-linear, function space defined through CNNs, or other suitable machine learning algorithm, enables non-linear learning of redundancies among coils, without learning specific k-space characteristics, which may lead to overfitting. It is a discovery of the present disclosure that modeling of the multi-coil system with a non-linear approximation with few degrees of freedom, instead of a linear approximation with similarly few degrees of freedom, is able to extract comparable coil information without overfitting, while offering improved noise resilience.

Another advantage of using non-linear estimation relates to the presence of noise in the calibration data. For the GRAPPA formulation above, there is noise in both the target data, b, and the calibration matrix, A. When both sources of noise are present, linear convolutional kernels incur a bias when estimated via least squares, and this bias leads to non-linear effects on the estimation of missing k-space lines from acquired ones. In the presence of such data imperfections, which are in addition to the model mismatches related to the degrees of freedom described earlier, a non-linear approximation procedure can improve reconstruction quality and reduce noise amplification.

In the systems and methods described in the present disclosure, the linear estimation in GRAPPA that utilizes convolutional kernels is replaced with a non-linear estimation that utilizes CNNs, or other suitable machine learning algorithms. The systems and methods described in the present disclosure are designed to calibrate the CNN, or other suitable machine learning algorithm, from ACS data without necessitating use of an external training database for learning.

CNNs are a special type of artificial neural network that are simple mathematical models that estimate a (potentially nonlinear) function $f: X \to Y$ for two arbitrary sets X and Y. A CNN combines multiple layers of simple modules, such as linear convolutions and certain point-wise nonlinear operators, in order to effectively represent complex functions of interest.

For the problem of nonlinearly estimating missing k-space data from acquired k-space data, a set of functions, $f_{j,m}$, are desired such that, $$S_j(k_x, k_y - m\Delta k_y) \approx f_{j,m}(\{S_c(k_x - b_x \Delta k_x, k_y - Rb_y \Delta k_y)\}_{b_x \in [-B_x, B_x], b_y \in [-B_y, B_y], c \in [1, n_c]}) \quad (3);$$

where [a,b] denotes the set of integers from a to b, inclusive. The functions $f_{j,m}$ can be approximated using CNNs, or other suitable machine learning algorithms, and their parameters can be learned from the ACS or other calibration data. Because deep learning procedures are commonly based on mappings over the real field, in some embodiments that implement CNNs, prior to any processing all the complex k-space data are mapped to real-valued numbers. A complex-valued k-space dataset, s, of size $n_x \times n_y \times n_c$, can be embedded into a real-valued space as a dataset of size $n_x \times n_y \times 2n_c$, where the real part of s is concatenated with the imaginary part of s along the third (channel) dimension. Thus, effectively $2n_c$ input channels can be processed. Other embeddings, which will change dimensionality in the other dimensions, are also possible.

As shown in the example of FIG. 1, the CNN acts on a local neighborhood of acquired points, as in GRAPPA, and includes multiple layers. Suppose $y_k$ is the input to the $k^{th}$ layer. Each layer will contain a convolution operation, specified by a set of convolution weights, $w_k$, and optional bias correction, $\beta_k$. Thus, the convolution operation at layer k performs, $$F_{k,conv}(y_k, w_k, \beta_k) = y_k * w_k + \beta_k \quad (4).$$

This is a multi-dimensional convolution, For the sake of simplicity, a two-dimensional convolution is described here; however, it will be appreciated by those skilled in the art that the convolution can readily be extended to higher dimensions. In the two-dimensional example, $w_k$ and $\beta_k$ have dimension $m_{k,1} \times m_{k,2} \times n_{k,i} \times n_{k,o}$ where $m_{k,1} m_{k,2}$ specifies the 2D localization; $n_{k,i}$ is the number of input channels, and $n_{k,o}$ is the number of output channels. For instance, for the first layer, $n_{k,i}$ can be taken as the number of coils in the acquisition. The number of output channels, $n_{k,o}$, tends to be larger than $n_{k,i}$, especially in the earlier layers, for successful feature extraction. As one example, the number of output channels can be equal to $(R-1) \cdot n_c$.

The convolution described above is similar to GRAPPA; however, by using a CNN or other suitable machine learning algorithm, non-linear processing can be implemented, unlike in traditional GRAPPA. This non-linear processing can be achieved using an activation function on the output of the convolution, $$ACT(F_{k,conv}(y_k, w_k, \beta_k)) \quad (5).$$

As one example, the activation function can be a rectified linear unit ("ReLU"), which can be defined as, $$\text{ReLU}(x) = \max(x, 0) \quad (6).$$

In some implementations, a batch normalization can be applied between the convolution and the activation function.

Thus, denoting the non-linearities at level k by $F_{k,non}$, the overall layer k function can be given as, $$F_k(y_k) = F_{k,non}(F_{k,conv}(y_k, w_k, \beta_k)) \quad (7).$$

It will be appreciated also that additional processing can be applied to the output of the convolution operation. For instance, resampling, upsampling, downsampling, max pooling, and so on, could be applied to the output of the convolution operation, whether before or after the non-linear activation function is applied. In some instances, in the last layer, only a convolution operation can be performed. For example, in these instances the last layer, K, can have, $$F_K(y_K) = F_{K,conv}(y_K, w_K, \beta_K) \quad (8).$$

The training portion of the algorithm aims to find the relevant parameters for the $k^{th}$ level (e.g., the convolution weights, or both weights and biases) for specified $m_{k,1}$, $m_{k,2}$, $n_{k,i}$, and $n_{k,o}$, and for all levels. Once these parameters are trained, the neural network, or other suitable machine learning algorithm is applied to the acquired sub-sampled dataset (e.g., undersampled k-space data) to estimate the missing points in k-space.

Figure 2:
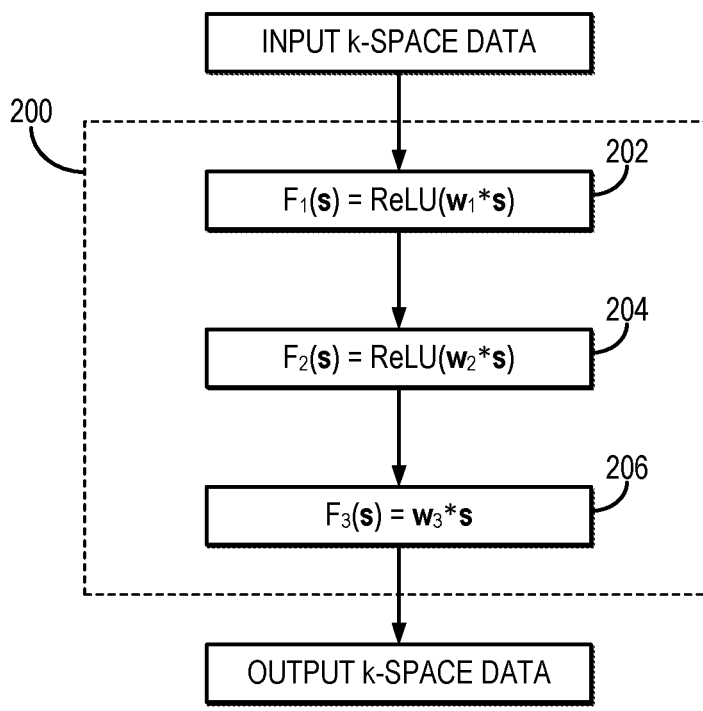
FIG. 2 is an example of a convolutional neural network ("CNN") implementing the methods described in the present disclosure.

Before a CNN or other suitable machine learning algorithm can be trained, its structure (e.g., the number of layers and layer operations) is determined. In one example implementation of the systems and methods described in the present disclosure, a three-layer structure can be used for a CNN, as depicted in FIG. 2. Each layer, except the last, is a combination of linear convolutional kernels and a nonlinear operation. As one example, the nonlinear operation can be a rectified linear unit ("ReLU"), which has desirable convergence properties. In other implementations, an activation function other than a ReLU function can also be used. As one example, the activation function could also be a sigmoid function. The linear convolution in CNNs can be defined as follows:

$$z = w * s = \sum_{m=1}^{n_c} \sum_{p=1}^{b_x} \sum_{q=1}^{b_y} w(p, q, m, j) \cdot s(x + p - 1, y + q - 1, m) \quad (9)$$

for $j = 1, \ldots, n_{out}$;

where s is input data of size $n_x \times n_y \times n_c$, w is a kernel of size $b_x \times b_y \times n_c \times n_{out}$, and z is the output data of size $(n_x - b_x + 1) \times (n_y - b_y + 1) \times n_{out}$.

FIG. 2 illustrates the structure of an example CNN 200 that can be implemented to estimate missing k-space lines. The first layer 202 receives as an input undersampled k-space data of size $n_x \times n_y \times 2n_c$, which in this instance is complex-valued data that has been embedded into the real field, as described above. The convolutional filters in this first layer 202, denoted by $w_1$, are of size $b_{1,x} \times b_{1,y} \times 2n_c \times n_1$. The operation of this layer is given as, $$F_1(s) = \text{ReLU}(w_1 * s) \quad (10);$$

although, as noted above, an activation function other than a ReLU function may also be implemented. The second layer 204 receives as an input the output from the first layer 202, and applies convolutional filters, denoted by $w_2$, of size $b_{2,x} \times b_{2,y} \times n_1 \times n_2$. The operation of this second layer 204 is given as, $$F_2(s) = \text{ReLU}(w_2 * s) \quad (11);$$

although, as noted above, an activation function other than a ReLU function may also be implemented. Intuitively, the first two layers are non-linearly combining the acquired k-space lines. The final layer 206 produces the desired reconstruction output by applying convolutional filters, $w_3$, of size $b_{3,x} \times b_{3,y} \times n_2 \times n_{out}$, yielding, $$F_3(s) = w_3 * s \tag{12}$$

Thus, in this example and in some other configurations, the final layer 206 can perform the output estimation without any nonlinear operations. In this example, the overall mapping is given by, $$F(s) = F_3(F_2(F_1(s))) \tag{13}$$

It is noted that a bias term is typically used in all layers in CNN applications, as mentioned above. In some embodiments, the bias terms are not included in the CNN or other suitable machine learning algorithm because the bias terms can change if the k-space is linearly scaled by a constant factor, for instance due to changes in the receiver gain.

In some implementations, the layers in the CNN or other suitable machine learning algorithm can use kernel dilation, such as kernel dilation of size R in the $k_y$ direction, to only process the acquired k-space lines. A CNN or other suitable machine learning algorithm can be implemented for each output channel, and the estimation of all the missing k-space lines, within the specified kernel size, can be performed, leading to $n_{out} = R-1$. When there are $2n_c$ output channels over the real field, as mentioned above, this process yields a set, $\{F_j(\cdot)\}_{j=1}^{2n_c}$, of non-linear reconstruction functions, where each $F_j(\cdot)$ is an approximation of $\{f_{j,m}\}_m$ in Eqn. (3) using CNNs or other suitable machine learning algorithms.

In order to learn a non-linear reconstruction function, $F_j(\cdot)$, the unknown network parameters, $\theta_j = \{w_1, w_2, w_3\}$ for that input channel are first estimated. Note that the subscript, j, has been omitted for the kernels for ease of notation. The input received by the CNN, or other suitable machine learning algorithm, is the zero-filled acquired k-space lines, s. A loss function between the reconstructed k-space lines is minimized using $F_j(\cdot)$ and the known ground truth for the target missing k-space lines in the ACS region, denoted by $Y_j$, which can be formatted to match the output structure with the same number of $n_{out}$ channels in the third dimension. One example of a loss function that can be used is the mean squared error ("MSE"), $$L(\theta_j) = \|Y_j - F_j(s; \theta_j)\|_F^2 \tag{14}$$

where $\|\cdot\|_F$ denotes the Frobenius norm. Instead of solving a linear least squares problem to calculate one set of convolutional kernels, as is done with GRAPPA, a non-linear least squares problem is solved to calculate multiple sets of convolutional kernels. In one example implementation, a gradient descent with backpropagation and momentum can be employed to minimize Eqn. (14). In such an example, in order to update the convolutional kernels, at iteration t, the following is used, $$\dot{w}_i^{(t)} = \mu \dot{w}_i^{(t-1)} + \eta \frac{\partial L}{\partial w_i^{(t-1)}}; \tag{15}$$

$$w_i^{(t)} = w_i^{(t-1)} - \dot{w}_i^{(t)}; \tag{16}$$

where $\mu$ is the momentum rate, $\eta$ is the learning rate, $i \in \{1, 2, 3\}$, and backpropagation is used to calculate the derivative, $\partial L/\partial w_i^{(t-1)}$. In some implementations, fixed values of the momentum rate and the learning rate can be used, and in some other implementations fixed rates are not used.

The same approach can be used to calculate all the convolutional filters in this example. Although stochastic gradient descent is popular in most deep learning applications due to the immense size of the training datasets, the methods described in the present disclosure can use a simple gradient descent due to the limited size of the ACS region. It will be appreciated, however, that stochastic gradient descent and other algorithms can be implemented to minimize Eqn. (14).

In one example study implementing the methods described in the present disclosure, the following parameters were used for a CNN: $b_{1,x}=5$, $b_{1,y}=2$, $n_1=32$, $b_{2,x}=1$, $b_{2,y}=1$, $n_2=8$, $b_{3,x}=3$, $b_{3,y}=2$, $n_{out}=R-1$. Note that with this choice of parameters, at most $2R$ $k_y$ lines are not estimated, which is the same as GRAPPA with a kernel size of [5,4]. Three convolutional kernels $\{w_1, w_2, w_3\}$ were trained for each output channel. The input is the zero-filled sub-sampled k-space, on which all the necessary Fourier transform shifts in k-space were performed using phase correction. Kernel dilation was used at each layer in order to process only the acquired data. It is noted that there is no effective dilation in the second layer due to the choice of kernel size that was used in the example. The momentum rate for the gradient descent described above was set to $\mu=0.9$. The learning rate is k-space scaling dependent. In this example, the k-space was scaled such that the maximum absolute value across all input channels was set to 0.015, and $\eta=100$ was used for the first layer of the CNN and $\eta=10$ was used for the second and third layers of the CNN. A slower learning rate for the later layers can help achieve convergence. The $n_{out}=R-1$ outputs per processed k-space location were placed back to the corresponding missing k-space locations, consistent with standard GRAPPA practice.

Figure 3:
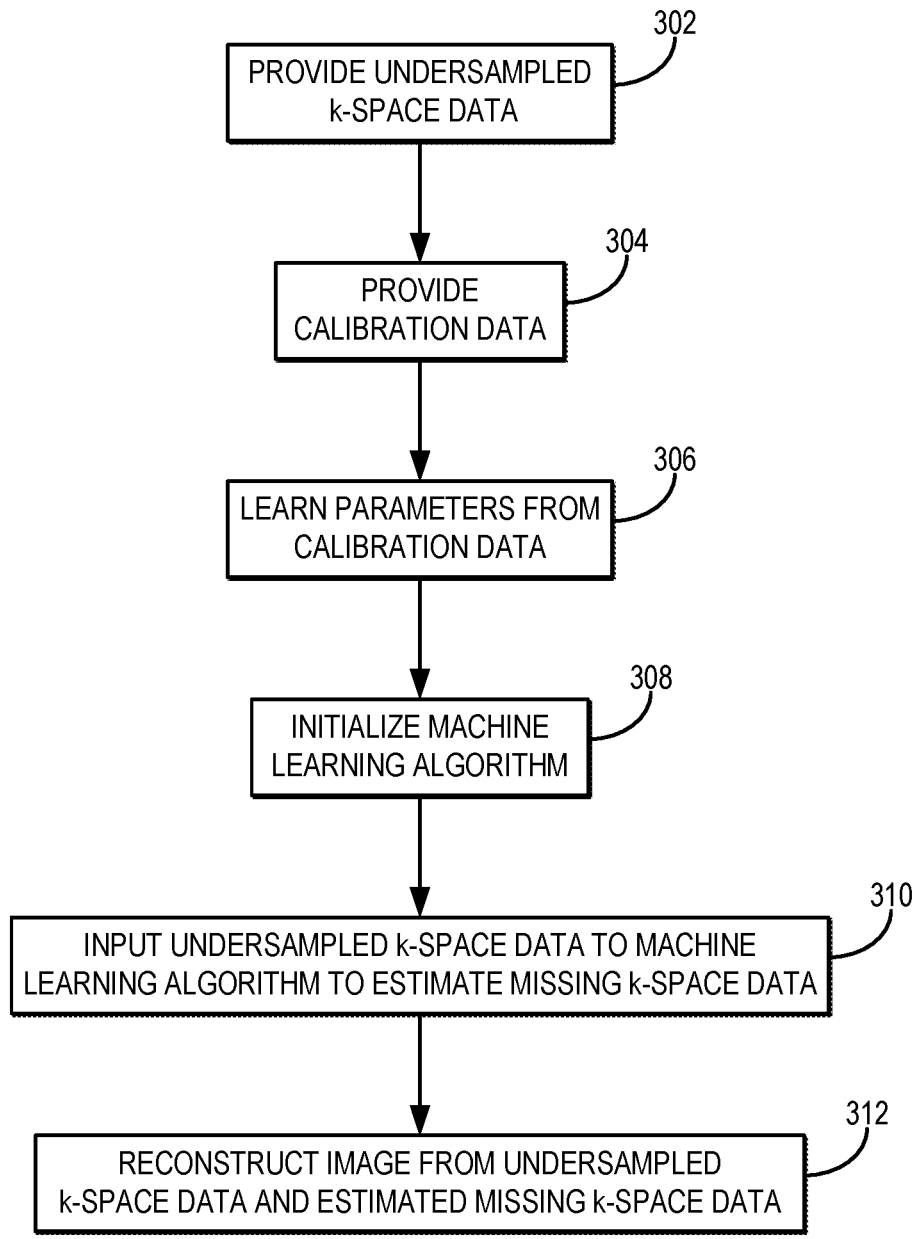
FIG. 3 is a flowchart setting forth the steps of an example method for reconstructing an image from undersampled k-space data using the methods described in the present disclosure.

Referring now to FIG. 3, a flowchart is illustrated as setting forth the steps of an example method for reconstructing an image from undersampled k-space data using a machine learning algorithm that is implemented with a hardware processor and memory; that is trained on calibration data, such as auto-calibration signal ("ACS") data; and that implements non-linear processing. The method includes providing undersampled k-space data to a computer system for reconstruction, as indicated at step 302. Providing the undersampled k-space data can include retrieving previously acquired data from a memory or other data storage, or can include acquiring such data with an MRI system. Calibration data is also provided to the computer system, as indicated at step 304. In some embodiments, the calibration data includes ACS signal data that is acquired with the under-sampled k-space data. In some other embodiments, the calibration data can include data acquired in a separate scan from the undersampled k-space data, such as in a calibration scan.

The calibration data are processed to learn parameters for the machine learning algorithm, as indicated at step 306. As one example, the machine learning algorithm is a convolutional neural network ("CNN") and the parameters are weights for each layer in the CNN. In some instances, the learned parameters may also include biases for one or more of the layers in the CNN. As another example, the machine learning algorithm can be an artificial neural network and the parameters are weights for the layers in the ANN, and can in some instances also include biases for one or more of the layers. In still other examples, machine learning algorithms other than neural networks can be implemented, such as support vector machines ("SVM") or other trained machine learning algorithms. The learning framework can include generating a set of non-linear functions, $F_{k,non}$, whose composite application on y (i.e., the selected neighborhood of a target point) leads to χ (i.e., the missing target value). The composite application of the non-linear functions can be given as, $$F_{tot}(y)=F_{K,non}(F_{K-1,non}(\cdots(F_{2,non}(F_{1,non}(y)))))\tag{17}$$

For all the target ACS training data, $X_{train}$, a loss function can be minimized. One such loss function is, $$\sum_{X_{train}\in ACS_{target}}\|F_{tot}(y)-X_{train}\|_2^2.\tag{18}$$

It will be appreciated that the undersampled k-space data, the calibration data, or both can be preprocessed before the machine learning algorithm is initialized. For instance, k-space scaling could be applied to the undersampled k-space data, the calibration data, or both. As another example, a mean signal can be subtracted from the undersampled k-space data, the calibration data, or both. These and other preprocessing steps can be applied as desired.

The machine learning algorithm is then initialized based on the learned parameters, as indicated at step 308. For the example where the machine learning algorithm is a CNN, the initialization can include selecting the number of layers, the number of input channels at each layer, the number of output channels at each layer, and forming processing to be applied at each layer. In general, at least some of the layers will include non-linear processing, as described above. Such non-linear processing can be achieved using an activation function on the output of the convolution. The activation function may include a rectified linear unit or other suitable activation function. In some implementations, a batch normalization can be applied between the convolution and the activation function.

Having initialized the machine learning algorithm, undersampled k-space data are input to the machine learning algorithm to estimate unacquired, or otherwise missing, k-space data points, as indicated at step 310. In some implementations, the machine learning algorithm can also be configured to estimate new values for already measured k-space data, such that the measured k-space data can be replaced with the new estimates output from the machine learning algorithm. Each measured value has a realization on the thermal noise. When data interpolation between multiple noisy samples is performed, a new average noise value may be added to the new estimated data value. Because the machine learning algorithms described in the present disclosure implement non-linear processing, they can also be used to replace the measured data with new values that have less noise. With this implementation, thermal noise in the measured k-space data can be reduced, which can be advantageous for imaging applications with lower undersampling (and typically low g-factors).

From the estimated missing k-space data and the original undersampled k-space data, images are then reconstructed, as indicated at step 312. It is noted that in some implementations the CNN, or other suitable machine learning algorithm, is configured to reconstructs each coil separately for parallel imaging; however, in some other implementations the CNN, or other suitable machine learning algorithm can implement a larger set of output channels in order to perform the reconstruction of all coils jointly.

As noted above, in some instances, it may be challenging to apply a CNN to complex-valued data. In these instances, the data can be embedded into a higher dimensional real space (e.g., from complex numbers to two-dimensional real space for each value), or by using more complex non-linear operations to replace the rectified linear unit.

Methods have been described for k-space reconstruction. The methods utilize deep learning on a small amount of scan-specific ACS data. Although the methods described in the present disclosure have been described with respect to uniformly undersampled acquisitions, the methods can be implemented for other sampling patterns, such as random and non-Cartesian. The methods described in the present disclosure can also be applied to both 2D and 3D acquisitions, as well as to simultaneous multi-slice ("SMS") imaging.

For example, when applying the methods described in the present disclosure to SMS applications, a concatenation of multiple ACS slices along the readout direction can be used to transform the reconstruction of SMS/multiband and in-plane accelerated k-space data to a two-dimensional interpolation problem along the phase encoding and the slice-concatenated readout direction. For such a 2D interpolation, the neural network parameters and topologies can be adapted. For instance, skip connections or longer memory can be implemented in the neural network. In some implementations, partial Fourier ("PF") reconstruction, which itself is non-linear, can be built into the reconstruction by training a mapping from $(k_x,k_y)$ locations to $(-k_x,-k_y)$ locations in the ACS region. The joint reconstruction of SMS/MB, parallel imaging, and PF can provide additional advantages for achieving high-resolution, full coverage, and short echo times in MRI applications such as diffusion, perfusion, and other quantitative imaging techniques. In some implementations, a single neural network, or other suitable machine learning algorithm, can be implemented to perform all of these three reconstructions together. In some other implementations, two neural networks, or other suitable machine learning algorithms, can be implemented: one for the combination of SMS/MB and parallel imaging, and one for PF imaging. In still other implementations, three different neural networks, or other suitable machine learning algorithms, can be implemented, one for each reconstruction stage. We will optimize the network architecture and CNN parameters as well.

As noted, the methods described in the present disclosure can also be applied to random undersampling patterns as an alternative to SPIRiT convolution kernels, and can be combined with image regularization in this setting.

As noted, the methods described in the present disclosure can also be applied to non-Cartesian acquisitions, as an alternative to linear convolutional approaches, such as radial or spiral acquisitions. As one example implementations, multiple CNNs, or other suitable machine learning algorithms, can be trained for different angular and radial regions of k-space. In some implementations when using non-Cartesian acquisitions, regularization, such as Tikhonov or sparsity, in the loss function for the network training can be used to further reduce effects of noise.

Unlike most recent deep learning approaches, the methods described in the present disclosure do not require a training database of images. Instead, the neural networks, or other suitable machine algorithms, are trained for each specific scan, or set of scans, with a limited amount of ACS or other calibration data. By using scan-specific and subject-specific deep learning, and learning all the necessary neural network, or other suitable machine learning algorithm, parameters from the ACS or other calibration data, dependence on training databases or assumptions about image compressibility can be avoided.

The methods described in the present disclosure enable the generation of a non-linear function to estimate the missing k-space data from the acquired k-space lines without additional training on databases containing many subjects. In effect, the methods described in the present disclosure create subject-specific neural networks, or other suitable machine learning algorithms, for a non-linear reconstruction. The methods described in the present disclosure offer improved noise performance compared to GRAPPA and other traditional parallel imaging techniques, which enables improved performance of the MRI system by allowing trade-offs in scan time or other acquisition parameters without increased noise. As one non-limiting example, for echo planar imaging ("EPI") acquisitions the improved reconstruction quality at higher acceleration rates can be used to reduce ghosting artifacts.

The use of non-linearity in the convolutional network, or other machine learning algorithm, architecture improves the noise performance of the reconstructions, as noted above. In some embodiments, the non-linearity can be introduced by the use of ReLU functions in all layers except the last one. Other non-linear activation functions, such as sigmoid functions can also be applied. The ReLU has several advantages. Because it has a gradient that is either 0 or 1, its derivative can be back-propagated across multiple layers without convergence issues, enabling deeper network architectures. The nature of the ReLU function also enables sparsity in representations. With a random initialization of weights, half of the output values are zeroes, facilitating an inherent data sparsification.

In most MRI applications where higher acceleration rates are commonly desired (e.g. diffusion, perfusion, or quantitative MRI), one set of high-quality ACS data of sufficient size that can be shared across multiple scans can be readily acquired. A set of CNNs, or other suitable machine learning algorithms, can be trained from one set of ACS data, even for varying contrast acquisitions. In some instances, the size of the ACS region may not be easily increased. In these cases, modifications to the methods described in the present disclosure can be made to improve performance. As one example, the number of layers could be reduced. As another example, the output sizes for each layer could be reduced. As still another example, a hybrid reconstruction could be implemented, in which a linear GRAPPA reconstruction is performed first in a region (e.g., the central region) to grow the ACS region and then use this larger area for training the neural network or other suitable machine learning algorithm.

In some implementations, residual learning can be used when training the neural network or other suitable machine learning algorithm. In such instances, missing k-space lines can be estimated first using a linear k-space interpolation. Residual data are generated by computing the difference between the true line and the estimate, and the neural network or other suitable machine learning algorithm can then be trained on the residual data.

In the examples described above, the kernel sizes were chosen to not increase the number of unestimated $k_y$ boundary lines beyond a [5,4] GRAPPA kernel, while enabling contributions from neighboring locations in the first and last layers. Other kernel sized can also be chosen, however.

In the examples described above, the number of layers and output sizes of each layer were chosen to limit the number of unknowns in the CNN, in order not to increase the required ACS data for training. The output size for the last layer was also a design choice, and the example neural networks described above were trained to output all missing lines per coil. Other alternatives are possible. For instance, a different neural network or other suitable machine learning algorithm can be trained per coil per each missing k-space locations relative to the acquisition location. As another example, the neural network or other suitable machine learning algorithm could be trained to output all the missing lines for all coils.

As mentioned above, in some implementations of a neural network, bias terms are excluded for the layers in the neural network. In standard deep learning practice, both a set of convolutional filters and a set of biases are trained at each layer. Due to their additive nature, inclusion of biases can increase dependence on how the $l_2$ (or $l_\infty$) norm of the k-space is scaled. This dependence can in some instances create limitations in processing data with multiple-varying contrast, as in quantitative MR parameter mapping, when training is done on one set of ACS data with a specific contrast weighting.

Although the methods described in the present disclosure do not require the use of so-called virtual channels, there may be some implementations where virtual channels can provide additional advantages. As one example, data from the receive channels can be prewhitened and the prewhitened signals can be decorrelated from the original signals on the channels. This processing, in effect, creates virtual channels. As another example, channel compression can be performed, which may be advantageous for RF systems that have a high number of receive channels. As still another example, the received signals can be augmented with their complex conjugate to double the number of received channels. This latter example can be advantageous for partial Fourier acquisitions.

Figure 4:
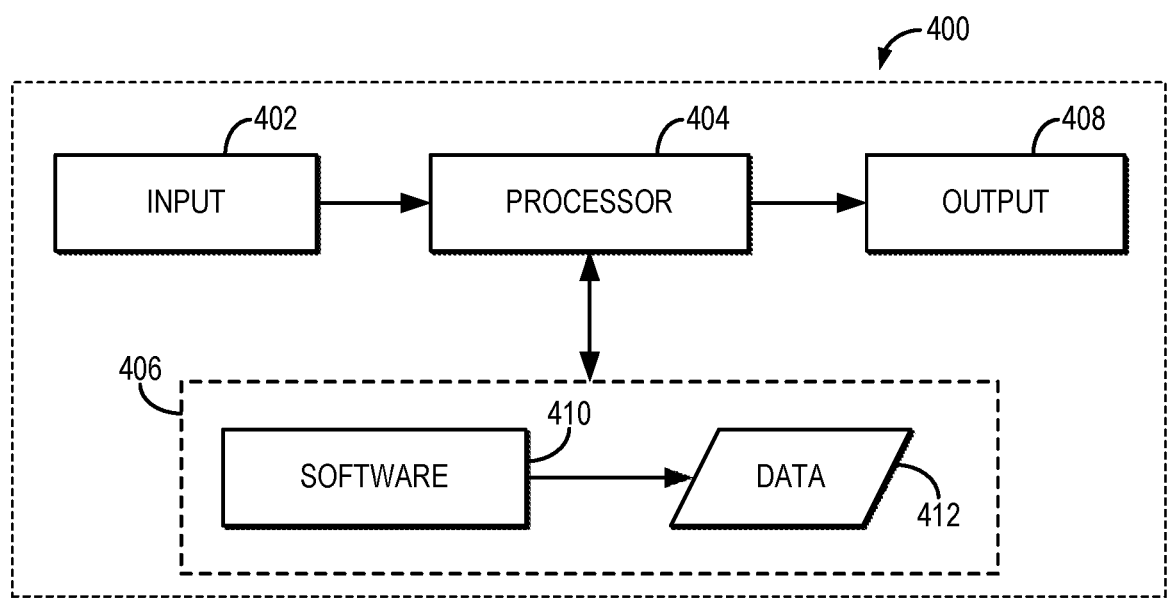
FIG. 4 is a block diagram of an example computer system that can implement the methods described in the present disclosure.

Referring now to FIG. 4, a block diagram of an example of a computer system 400 that can implement the methods described in the present disclosure is shown. The computer system 400 includes an input 402, at least one processor 404, a memory 406, and an output 408. The computer system 400 can also include any suitable device for reading computer-readable storage media. The computer system 400 may be implemented, in some examples, as a workstation, a notebook computer, a tablet device, a mobile device, a multimedia device, a network server, a mainframe, or any other general-purpose or application-specific computing device.

The computer system 400 may operate autonomously or semi-autonomously, or may read executable software instructions from the memory 406 or a computer-readable medium (e.g., a hard drive, a CD-ROM, flash memory), or may receive instructions via the input 402 from a user, or any another source logically connected to a computer or device, such as another networked computer or server. In general, the computer system 400 is programmed or otherwise configured to implement the methods and algorithms described above.

The input 402 may take any suitable shape or form, as desired, for operation of the computer system 400, including the ability for selecting, entering, or otherwise specifying parameters consistent with performing tasks, processing data, or operating the computer system 400. In some aspects, the input 402 may be configured to receive data, such as undersampled k-space data, auto-calibration signal ("ACS") data, and so on. Such data may be processed as described above to train a machine learning algorithm, to estimate missing k-space data, to reconstruct magnetic resonance images, and so on. In addition, the input 402 may also be configured to receive any other data or information considered useful for training a machine learning algorithm, estimating missing k-space data, reconstructing magnetic resonance images, and so on, using the methods described above.

Among the processing tasks for operating the signal reconstruction unit 400, the at least one processor 404 may also be configured to carry out any number of post-processing steps on data received by way of the input 402.

The memory 406 may contain software 410 and data 412, such as magnetic resonance images, patient health data, and so on, and may be configured for storage and retrieval of processed information, instructions, and data to be processed by the at least one processor 404. In some aspects, the software 410 may contain instructions directed to implementing the methods described in the present disclosure.

In addition, the output 408 may take any shape or form, as desired, and may be configured for displaying, in addition to other desired information, reconstructed signals or images.

Figure 5:
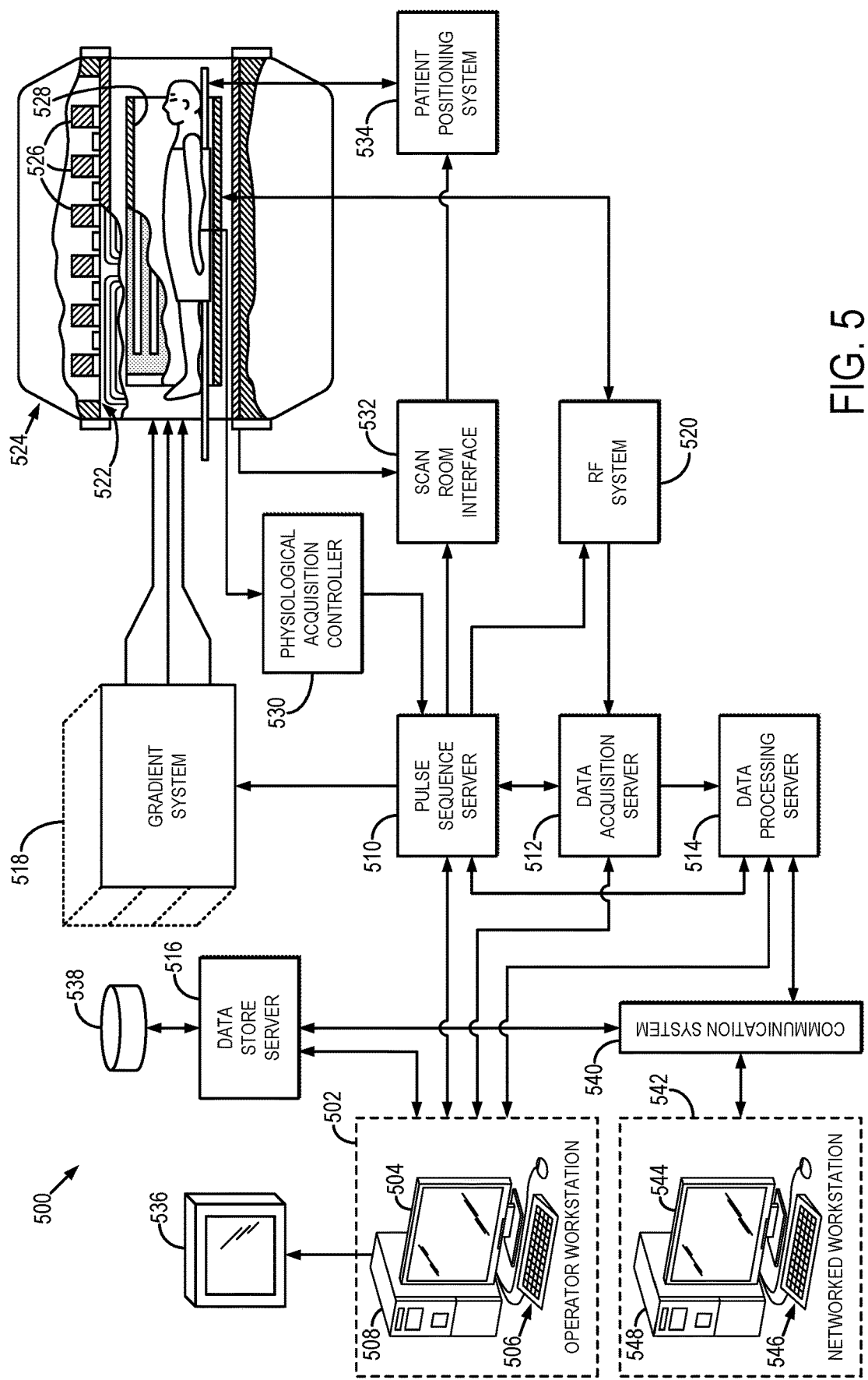
FIG. 5 is a block diagram of an example magnetic resonance imaging ("MRI") system that can implement the methods described in the present disclosure.

Referring particularly now to FIG. 5, an example of an MRI system 500 that can implement the methods described here is illustrated. The MRI system 500 includes an operator workstation 502 that may include a display 504, one or more input devices 506 (e.g., a keyboard, a mouse), and a processor 508. The processor 508 may include a commercially available programmable machine running a commercially available operating system. The operator workstation 502 provides an operator interface that facilitates entering scan parameters into the MRI system 500. The operator workstation 502 may be coupled to different servers, including, for example, a pulse sequence server 510, a data acquisition server 512, a data processing server 514, and a data store server 516. The operator workstation 502 and the servers 510, 512, 514, and 516 may be connected via a communication system 540, which may include wired or wireless network connections.

The pulse sequence server 510 functions in response to instructions provided by the operator workstation 502 to operate a gradient system 518 and a radiofrequency ("RF") system 520. Gradient waveforms for performing a prescribed scan are produced and applied to the gradient system 518, which then excites gradient coils in an assembly 522 to produce the magnetic field gradients $G_x$, $G_y$, and $G_z$ that are used for spatially encoding magnetic resonance signals. The gradient coil assembly 522 forms part of a magnet assembly 524 that includes a polarizing magnet 526 and a whole-body RF coil 528.

RF waveforms are applied by the RF system 520 to the RF coil 528, or a separate local coil to perform the prescribed magnetic resonance pulse sequence. Responsive magnetic resonance signals detected by the RF coil 528, or a separate local coil, are received by the RF system 520. The responsive magnetic resonance signals may be amplified, demodulated, filtered, and digitized under direction of commands produced by the pulse sequence server 510. The RF system 520 includes an RF transmitter for producing a wide variety of RF pulses used in MRI pulse sequences. The RF transmitter is responsive to the prescribed scan and direction from the pulse sequence server 510 to produce RF pulses of the desired frequency, phase, and pulse amplitude waveform. The generated RF pulses may be applied to the whole-body RF coil 528 or to one or more local coils or coil arrays.

The RF system 520 also includes one or more RF receiver channels. An RF receiver channel includes an RF preamplifier that amplifies the magnetic resonance signal received by the coil 528 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \tag{19};$$

and the phase of the received magnetic resonance signal may also be determined according to the following relationship:

$$\varphi = \tan^{-1}\left(\frac{Q}{I}\right). \tag{20}$$

The pulse sequence server 510 may receive patient data from a physiological acquisition controller 530. By way of example, the physiological acquisition controller 530 may receive signals from a number of different sensors connected to the patient, including electrocardiograph ("ECG") signals from electrodes, or respiratory signals from a respiratory bellows or other respiratory monitoring devices. These signals may be used by the pulse sequence server 510 to synchronize, or "gate," the performance of the scan with the subject's heart beat or respiration.

The pulse sequence server 510 may also connect to a scan room interface circuit 532 that receives signals from various sensors associated with the condition of the patient and the magnet system. Through the scan room interface circuit 532, a patient positioning system 534 can receive commands to move the patient to desired positions during the scan.

The digitized magnetic resonance signal samples produced by the RF system 520 are received by the data acquisition server 512. The data acquisition server 512 operates in response to instructions downloaded from the operator workstation 502 to receive the real-time magnetic resonance data and provide buffer storage, so that data is not lost by data overrun. In some scans, the data acquisition server 512 passes the acquired magnetic resonance data to the data processor server 514. In scans that require information derived from acquired magnetic resonance data to control the further performance of the scan, the data acquisition server 512 may be programmed to produce such information and convey it to the pulse sequence server 510. For example, during pre-scans, magnetic resonance data may be acquired and used to calibrate the pulse sequence performed by the pulse sequence server 510. As another example, navigator signals may be acquired and used to adjust the operating parameters of the RF system 520 or the gradient system 518, or to control the view order in which k-space is sampled. In still another example, the data acquisition server 512 may also process magnetic resonance signals used to detect the arrival of a contrast agent in a magnetic resonance angiography ("MRA") scan. For example, the data acquisition server 512 may acquire magnetic resonance data and processes it in real-time to produce information that is used to control the scan.

The data processing server 514 receives magnetic resonance data from the data acquisition server 512 and processes the magnetic resonance data in accordance with instructions provided by the operator workstation 502. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 514 are conveyed back to the operator workstation 502 for storage. Real-time images may be stored in a data base memory cache, from which they may be output to operator display 502 or a display 536. Batch mode images or selected real time images may be stored in a host database on disc storage 538. When such images have been reconstructed and transferred to storage, the data processing server 514 may notify the data store server 516 on the operator workstation 502. The operator workstation 502 may be used by an operator to archive the images, produce films, or send the images via a network to other facilities.

The MRI system 500 may also include one or more networked workstations 542. For example, a networked workstation 542 may include a display 544, one or more input devices 546 (e.g., a keyboard, a mouse), and a processor 548. The networked workstation 542 may be located within the same facility as the operator workstation 502, or in a different facility, such as a different healthcare institution or clinic.

The networked workstation 542 may gain remote access to the data processing server 514 or data store server 516 via the communication system 540. Accordingly, multiple networked workstations 542 may have access to the data processing server 514 and the data store server 516. In this manner, magnetic resonance data, reconstructed images, or other data may be exchanged between the data processing server 514 or the data store server 516 and the networked workstations 542, such that the data or images may be remotely processed by a networked workstation 542.

The present disclosure has described one or more preferred embodiments, and it should be appreciated that many equivalents, alternatives, variations, and modifications, aside from those expressly stated, are possible and within the scope of the invention.

The invention claimed is:

1. A method for reconstructing an image from undersampled k-space data acquired with a magnetic resonance imaging (MRI) system, the steps of the method comprising:
   (a) providing to a computer system, undersampled k-space data and calibration data acquired with an MRI system;
   (b) processing the calibration data with a computer system to learn parameters for a machine learning algorithm implemented with a hardware processor and memory of the computer system;
   (c) estimating missing k-space data by inputting the undersampled k-space data to the machine learning algorithm; and
   (d) reconstructing an image from the undersampled k-space data and the estimated missing k-space data.

2. The method as recited in claim 1, wherein the machine learning algorithm is a neural network.

3. The method as recited in claim 2, wherein the neural network includes at least one layer that implements a non-linear activation function.

4. The method as recited in claim 2, wherein the neural network is a convolutional neural network.

5. The method as recited in claim 4, wherein the convolutional neural network comprises a plurality of layers in which each layer includes applying a convolution operation on data input to that layer, wherein each of the plurality of layers comprises a number of input channels and a number of output channels, and wherein at least some of the plurality of layers comprise applying non-linear processing on an output of the convolution operation.

6. The method as recited in claim 5, wherein the learned parameters comprise weights for the convolution operation in each layer.

7. The method as recited in claim 6, wherein the learned parameters further comprise biases for at least some of the plurality of layers.

8. The method as recited in claim 5, wherein the non-linear processing includes applying an activation function to the output of the convolution operation.

9. The method as recited in claim 8, wherein the activation function comprises a rectified linear unit.

10. The method as recited in claim 5, wherein the non-linear processing includes applying batch normalization to the output of the convolution operation.

11. The method as recited in claim 2, wherein the neural network comprises a plurality of layers in which at least some of the plurality of layers implement non-linear processing.

12. The method as recited in claim 11, where each of the plurality of layers except a last one of the plurality of layers implement non-linear processing.

13. The method as recited in claim 1, wherein the calibration data are acquired as auto-calibration signal (ACS) data together with the undersampled k-space data.

14. The method as recited in claim 1, wherein the calibration data are acquired in a separate scan from the undersampled k-space data.

15. The method as recited in claim 1, wherein the undersampled k-space data are complex-valued data, and step (c) includes embedding the undersampled k-space data in a higher dimensional real space before inputting the undersampling k-space data to the machine learning algorithm.

16. The method as recited in claim 1, wherein step (b) includes applying a linear k-space interpolation to the calibration data to increase a size of the calibration data before processing the calibration data to learn the parameters for the machine learning algorithm.

17. The method as recited in claim 1, wherein step (a) includes acquiring the undersampled k-space data and the calibration data with the MRI system and providing the undersampled k-space data and the calibration data to the computer system.

18. The method as recited in claim 1, where processing the calibration data with a computer system to learn the parameters for the machine learning algorithm includes minimizing a loss function.

19. The method as recited in claim 18, wherein the loss function is a mean squared error.

20. The method as recited in claim 1, wherein the undersampled k-space data sample k-space using a Cartesian sampling pattern.

21. The method as recited in claim 1, wherein the undersampled k-space data sample k-space using a non-Cartesian sampling pattern.

22. The method as recited in claim 1, wherein the undersampled k-space data are three-dimensional k-space data.

23. The method as recited in claim 1, wherein the undersampled k-space data were acquired from multiple different slices simultaneously using a simultaneous multislice acquisition and the calibration data include calibration data for each of the multiple different slices.

24. The method as recited in claim 1, wherein estimating the missing k-space data in step (c) further comprises estimating replacement values for at least some of the undersampling k-space data by inputting the undersampled k-space data to the machine learning algorithm, and wherein values in the undersampled k-space data for which replacement values are estimated are replaced by the replacement values before reconstructing the image in step (d).

25. A method for reconstructing an image from undersampled k-space data acquired with a magnetic resonance imaging (MRI) system, the steps of the method comprising:
 (a) providing to a computer system, undersampled k-space data and calibration data acquired with an MRI system;
 (b) processing the calibration data in a k-space domain to learn a non-linear mapping from the calibration data;
 (c) estimating missing k-space data by directly applying the non-linear mapping to the undersampled k-space data; and
 (d) reconstructing an image from the undersampled k-space data and the estimated missing k-space data.

\* \* \* \* \*